United States Patent
Tsai et al.

(10) Patent No.: US 11,908,813 B2
(45) Date of Patent: Feb. 20, 2024

(54) DISPLAY DEVICE

(71) Applicant: InnoLux Corporation, Miao-Li County (TW)

(72) Inventors: Tsung-Lun Tsai, Miao-Li County (TW); Bo-Yuan Hou, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/053,413

(22) Filed: Nov. 8, 2022

(65) Prior Publication Data

US 2023/0066211 A1 Mar. 2, 2023

Related U.S. Application Data

(63) Continuation of application No. 17/316,916, filed on May 11, 2021, now Pat. No. 11,521,942, which is a continuation of application No. 16/781,254, filed on Feb. 4, 2020, now Pat. No. 11,037,889.

(30) Foreign Application Priority Data

Feb. 22, 2019 (CN) .................. 201910133251.X

(51) Int. Cl.
*H01L 23/60* (2006.01)
*H01L 27/12* (2006.01)
*H01L 23/532* (2006.01)
*H01L 23/528* (2006.01)

(52) U.S. Cl.
CPC ............ *H01L 23/60* (2013.01); *H01L 23/528* (2013.01); *H01L 23/53238* (2013.01); *H01L 23/53266* (2013.01); *H01L 27/124* (2013.01); *H01L 27/1259* (2013.01)

(58) Field of Classification Search
CPC . H01L 23/60; H01L 23/528; H01L 23/53238; H01L 23/53266; H01L 27/124; H01L 27/1259; H01L 27/0288
See application file for complete search history.

(56) References Cited

U.S. PATENT DOCUMENTS

| | | | | |
|---|---|---|---|---|
| 5,285,300 | A * | 2/1994 | Suzuki | G02F 1/134336 349/111 |
| 5,790,215 | A * | 8/1998 | Sugahara | G02F 1/1347 349/111 |
| 6,069,398 | A * | 5/2000 | Kadosh | H01L 28/20 257/536 |
| 7,782,411 | B2 * | 8/2010 | Shie | G02F 1/13452 349/40 |
| 7,893,902 | B2 * | 2/2011 | Shie | G09G 3/3696 345/212 |
| 7,986,391 | B2 * | 7/2011 | Shie | G02F 1/13452 349/149 |

(Continued)

*Primary Examiner* — Caleb E Henry
(74) *Attorney, Agent, or Firm* — McClure, Qualey & Rodack, LLP

(57) ABSTRACT

A display device having a non-display region is provided. The display device includes a first conductive line to which a voltage is applied and a second conductive line which is at least partially overlapped with the first conductive line. There is a distance between the first conductive line and the second conductive line in a normal direction of the display device is greater than or equal to 3500 angstroms, and less than or equal to 4500 angstroms.

12 Claims, 8 Drawing Sheets

(56) References Cited

U.S. PATENT DOCUMENTS

| | | | | |
|---|---|---|---|---|
| 8,020,024 B2* | 9/2011 | Chen | ................ | G06F 1/24 |
| | | | | 360/323 |
| 8,031,281 B2* | 10/2011 | Yang | ................ | G09G 3/3648 |
| | | | | 349/40 |
| 8,139,174 B2* | 3/2012 | Lin | ................ | G02F 1/136204 |
| | | | | 349/43 |
| 8,144,026 B2* | 3/2012 | Yan | ................ | H01L 23/60 |
| | | | | 340/653 |
| 8,300,194 B2* | 10/2012 | Chen | ................ | G02F 1/1336 |
| | | | | 349/149 |
| 8,300,198 B2* | 10/2012 | Shie | ................ | G02F 1/13452 |
| | | | | 349/150 |
| 8,866,983 B2* | 10/2014 | Ai | ................ | G02F 1/133308 |
| | | | | 349/40 |
| 9,134,858 B2* | 9/2015 | Nien | ................ | G06F 3/0446 |
| 9,158,162 B2* | 10/2015 | Liu | ................ | G02F 1/134363 |
| 9,513,514 B2* | 12/2016 | Chen | ................ | G02F 1/1339 |
| 9,563,082 B2* | 2/2017 | Wu | ................ | G02F 1/13452 |
| 9,646,559 B2* | 5/2017 | Min | ................ | G09G 3/3685 |
| 9,791,973 B2* | 10/2017 | Kurasawa | ................ | G06F 3/0412 |
| 10,079,229 B1* | 9/2018 | Bi | ................ | H01L 29/7851 |
| 10,627,946 B2* | 4/2020 | Bian | ................ | G06F 3/041 |
| 10,797,046 B1* | 10/2020 | Shu | ................ | H01L 27/0886 |
| 2006/0001371 A1* | 1/2006 | Jang | ................ | H01J 11/12 |
| | | | | 313/582 |
| 2008/0150145 A1* | 6/2008 | King | ................ | H01L 23/5329 |
| | | | | 257/762 |
| 2009/0033597 A1* | 2/2009 | Sung | ................ | G09G 3/006 |
| | | | | 345/76 |
| 2011/0096258 A1* | 4/2011 | Shim | ................ | H01L 27/1255 |
| | | | | 438/34 |
| 2014/0104259 A1* | 4/2014 | Oh | ................ | G09G 3/3266 |
| | | | | 345/212 |
| 2015/0001501 A1* | 1/2015 | Cho | ................ | H10K 50/8426 |
| | | | | 257/40 |
| 2015/0261030 A1* | 9/2015 | Chen | ................ | G02F 1/1339 |
| | | | | 349/138 |
| 2015/0261050 A1* | 9/2015 | Chen | ................ | G02F 1/133512 |
| | | | | 349/42 |
| 2015/0262536 A1* | 9/2015 | Chen | ................ | G02F 1/13394 |
| | | | | 345/92 |
| 2016/0035702 A1* | 2/2016 | Luo | ................ | H01L 24/75 |
| | | | | 156/345.24 |
| 2017/0023840 A1* | 1/2017 | Chen | ................ | G02F 1/13394 |
| 2018/0047681 A1* | 2/2018 | Yang | ................ | H01L 27/127 |
| 2018/0254315 A1* | 9/2018 | Verma | ................ | H01L 21/76802 |
| 2020/0273819 A1* | 8/2020 | Tsai | ................ | H01L 23/53266 |

* cited by examiner

DISPLAY DEVICE

CROSS REFERENCE TO RELATED APPLICATIONS

This application is a Continuation of U.S. patent application Ser. No. 17/316,916, filed on May 11, 2021 (now U.S. Pat. No. 11,521,942, issued on Dec. 6, 2022), which is a Continuation of U.S. patent application Ser. No. 16/781,254, filed on Feb. 4, 2020 (now U.S. Pat. No. 11,037,889, issued on Jun. 15, 2021), which claims priority of China Patent Application No. 201910133251.X, filed on Feb. 22, 2019, the entirety of which are incorporated by reference herein.

BACKGROUND

Technical Field

The disclosure relates to a display device, and in particular, to a display device which reduces electrostatic damage.

Description of the Related Art

As digital technology develops, display devices are becoming more widely used in our daily lives. For example, display devices are used in modern information and communication devices, such as televisions, notebooks, computers, mobile phones and smartphones, which have been developed to be much thinner, lighter, smaller and/or more fashionable.

During the fabrication or assembly of display devices, the operation of equipment, contact with operators or display devices themselves may cause electrostatic discharge. The phenomenon of the electrostatic discharge is due to the accumulation of a plurality of electrostatic charges. Since components and the wiring of display devices are quite delicate, such an electrostatic discharge can cause display devices to malfunction. Accordingly, electrostatic damage to a display device due to electrostatic discharge may lead to a lower yield, and this needs to be resolved.

BRIEF SUMMARY OF THE DISCLOSURE

A display device is provided according to some embodiments of the disclosure. A display device having a non-display region is provided according to other embodiments of the disclosure. The display device includes a first conductive line to which a voltage is applied and a second conductive line which is at least partially overlapped with the first conductive line. There is a distance between the first conductive line and the second conductive line in a normal direction of the display device is greater than or equal to 3500 angstroms, and less than or equal to 4500 angstroms.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION OF THE DISCLOSURE

Figure 1A:
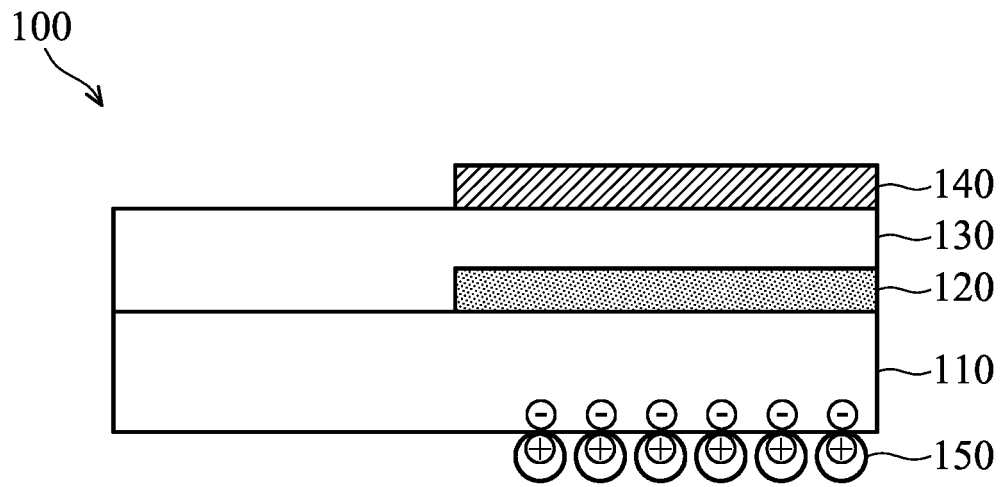
FIGS. 1A-1C are schematic diagrams illustrating the electrostatic discharge effect.

The display device provided in the disclosure is described in detail in the following description. In the following detailed description, for purposes of explanation, numerous specific details and embodiments are set forth in order to provide a thorough understanding of the disclosure. The specific elements and configurations described in the following detailed description are set forth in order to clearly describe the disclosure. It will be apparent, however, that the exemplary embodiments set forth herein are used merely for the purpose of illustration, and the inventive concept may be embodied in various forms without being limited to those exemplary embodiments. In addition, drawings of different embodiments may use like and/or corresponding numerals to denote like and/or corresponding elements in order to clearly describe the disclosure. However, the use of like and/or corresponding numerals in the drawings of different embodiments does not suggest any correlation between different embodiments. In addition, in this specification, expressions such as "first material layer disposed on or over a second material layer", may indicate the direct contact of the first material layer and the second material layer, or it may indicate one or more intermediate layers formed between the first material layer and the second material layer. In the above situation, the first material layer may not be in direct contact with the second material layer.

The terms "about", "approximately" and "substantially" typically mean +/−20% of the stated value, or typically mean +/−10% of the stated value, or typically mean +/−5% of the stated value, or typically mean +/−3% of the stated value, or typically mean +/−2% of the stated value, or typically mean +/−1% of the stated value, or typically mean +/−0.5% of the stated value. The stated value of the disclosure is an approximate value. When there is no specific description, the stated value includes the meaning of "about", "approximately" or "substantially".

It should be understood that, although the terms first, second, third, etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the disclosure and the background or the context of the disclosure, and should not be interpreted in an idealized or overly formal manner unless so defined.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

In addition, in some embodiments of the disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It should be noted that the term "substrate" or "panel" are meant to include devices formed on a transparent substrate and the layers overlying the transparent substrate, wherein all active elements (ex. transistors) needed may be already formed over the substrate. However, the substrate shown in the accompanying drawings is represented with a flat surface in order to simplify the drawings.

The thickness of a structure described in some embodiments of the disclosure is meant to be measured with a plurality of thickness values in cross-sectional diagrams (such as SEM images) of a region under-test, which may result in an average of the thickness. Furthermore, the standard deviation may be calculated with variance resulted from these thickness values and the average thereof. The range of the thickness values in the disclosure encompasses the value within three standard deviations.

Figure 1B:
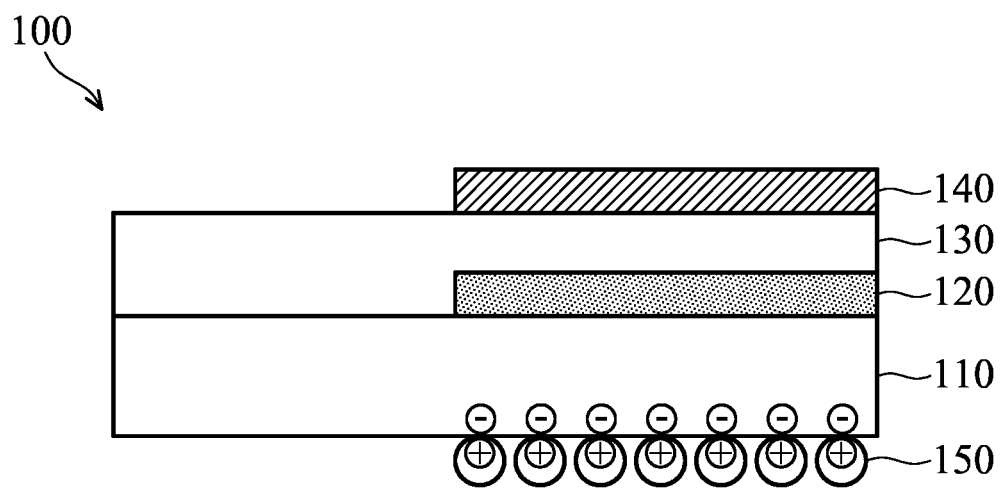
Figure 1C:
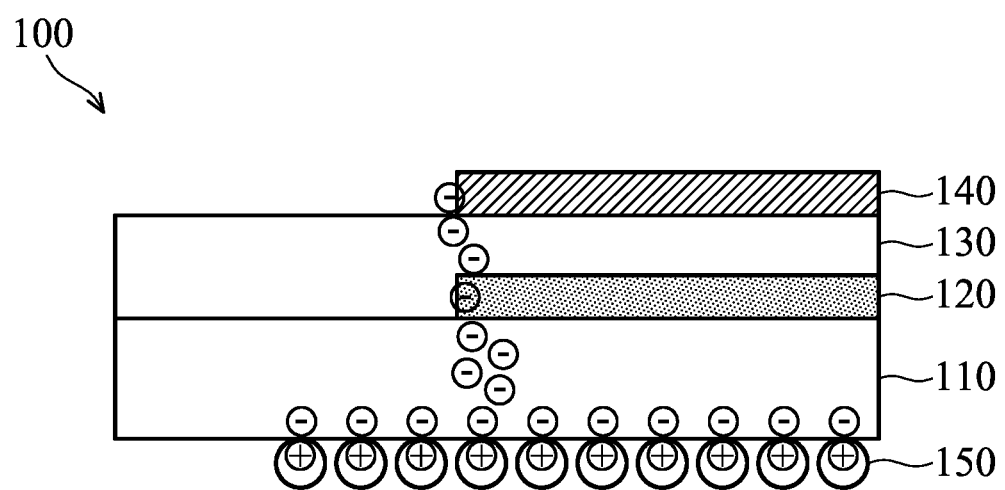

Referring to FIGS. 1A-1C, FIGS. 1A-1C are schematic diagrams illustrating the electrostatic discharge effect (ESD). During the fabrication of a display device 100, the display device 100 is moved to various process sites by a roller transport device 150. As shown in FIG. 1A, the display device 100 may include a substrate 110, a metal layer 120, a passivation layer 130 and a metal layer 140. It should be noted that some components of the display device 100 are omitted for the purpose of clearly depicting the electrostatic discharge effect.

The substrate 110 may include a non-flexible substrate or a flexible substrate. For example, a non-flexible substrate may include a glass substrate, a sapphire substrate, or another suitable substrate, and the flexible substrate may include a ceramic substrate, a plastic substrate, or another suitable substrate, wherein the material of the plastic substrate may include, but is not limited to, polyimide (PI), polyethylene terephthalate (PET), polycarbonate (PC), polyethersulfone (PES), Polybutylene terephthalate (PBT), Polyethylene naphthalate (PEN), polyarylate (PAR), another suitable material, or a combination thereof. The metal layer 120 is disposed on the substrate 110. The material of the metal layer 120 may include a metal such as, but not limited to, Al, Mo, Ti, Cu, Ag, W, Au, Cr, Ni, Pt, Jr, Rh, In, Bi, or an alloy of thereof. In addition, the metal layer 120 may be a mono-layer structure or a multi-layer structure made of different metal layers.

As shown in FIG. 1A, the passivation layer 130 is disposed on the metal layer 120. The material of the passivation layer 130 may include, but is not limited to, silicon oxide, silicon nitride, silicon oxynitride, or epoxy. The metal layer 140 is disposed on the passivation layer 130. The material of the metal layer 140 may be the same as or similar to the material of the metal layer 120, which is not repeated herein.

As shown in FIGS. 1A and 1B, when the display device 100 is transported using the roller transport device 150, static electricity is generated between the roller transport device 150 and the substrate 110 due to friction. For example, positive charges may be generated on the surface of the roller transport device 150, and negative charges may be generated on the surface of the substrate 110. As the contact area between the roller transport device 150 and the substrate 110 becomes greater, more electrostatic charges may accumulate on the surfaces of both the roller transport device 150 and the substrate 110.

As shown in FIG. 1C, when a large quantity of electrostatic charges accumulate on the surface of the underlying substrate 110 on the edge of the metal layer 120, the corner of the metal layer 120 may tend to attract the negative charges from the substrate 110, thereby resulting in the negative charges initially located on the surface of the substrate 110 moving to the metal layer 120 through the substrate 110. When the thickness of the passivation layer 130 is too small, the corner of the metal layer 140 may also tend to attract negative charges, thereby resulting in the negative charges moving from the metal layer 120 to the metal layer 140 through the passivation layer 130. As shown in FIG. 1C, a transduction path for negative charges is formed between the metal layer 120 and the metal layer 140, leading to the electrostatic discharge effect with the roller transport device 150 to punch through at least one portion of the passivation layer 130 so that electrical insulation between the metal layer 120 and the metal layer 140 is rendered ineffective and an electrical connection is made. This may result in a reduced production yield of display devices. More specifically, electrostatic discharges are particularly generated at the edge of two adjacent metal layers.

Figure 2A:
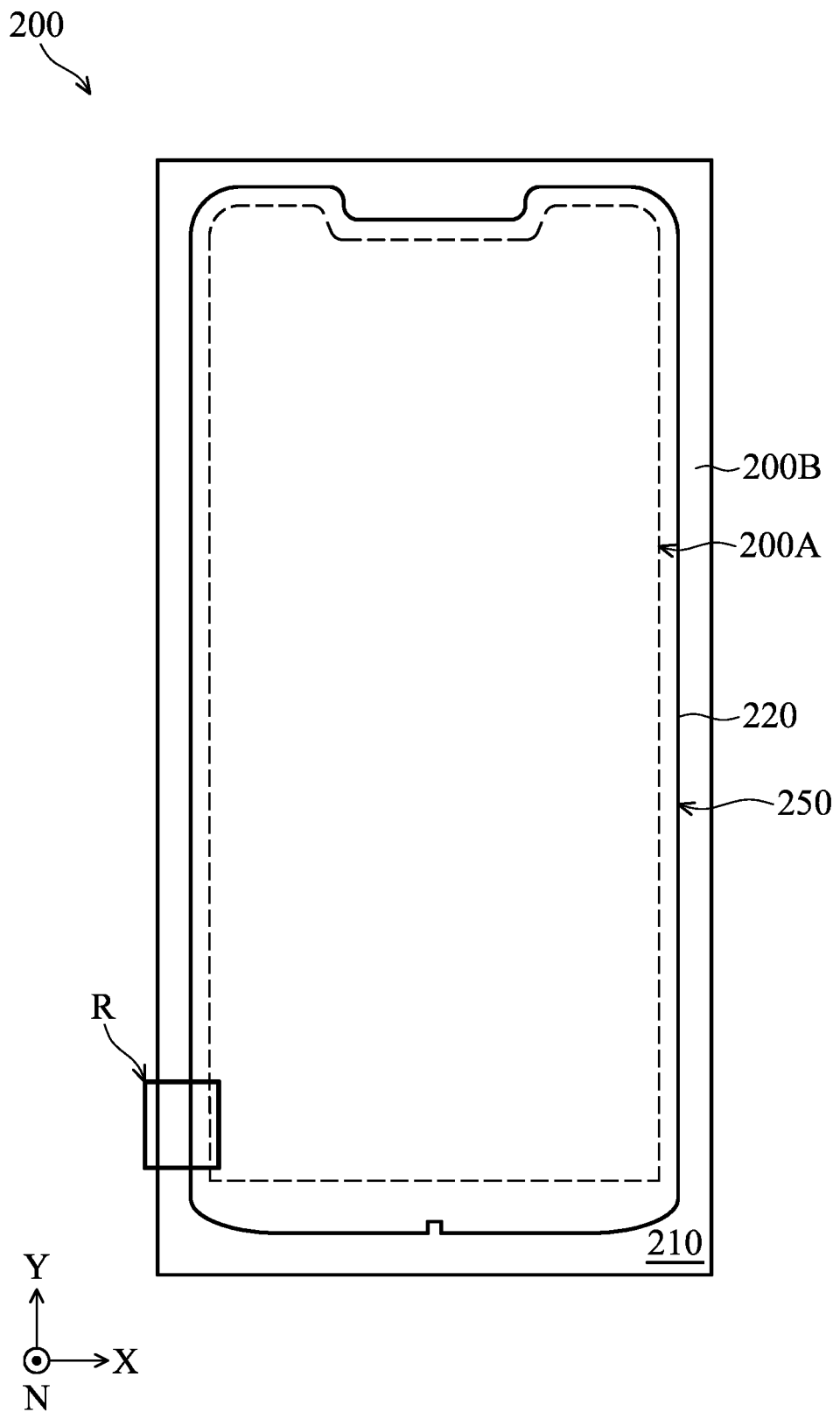
FIG. 2A is a top-view diagram of a conventional display device.
Figure 2B:
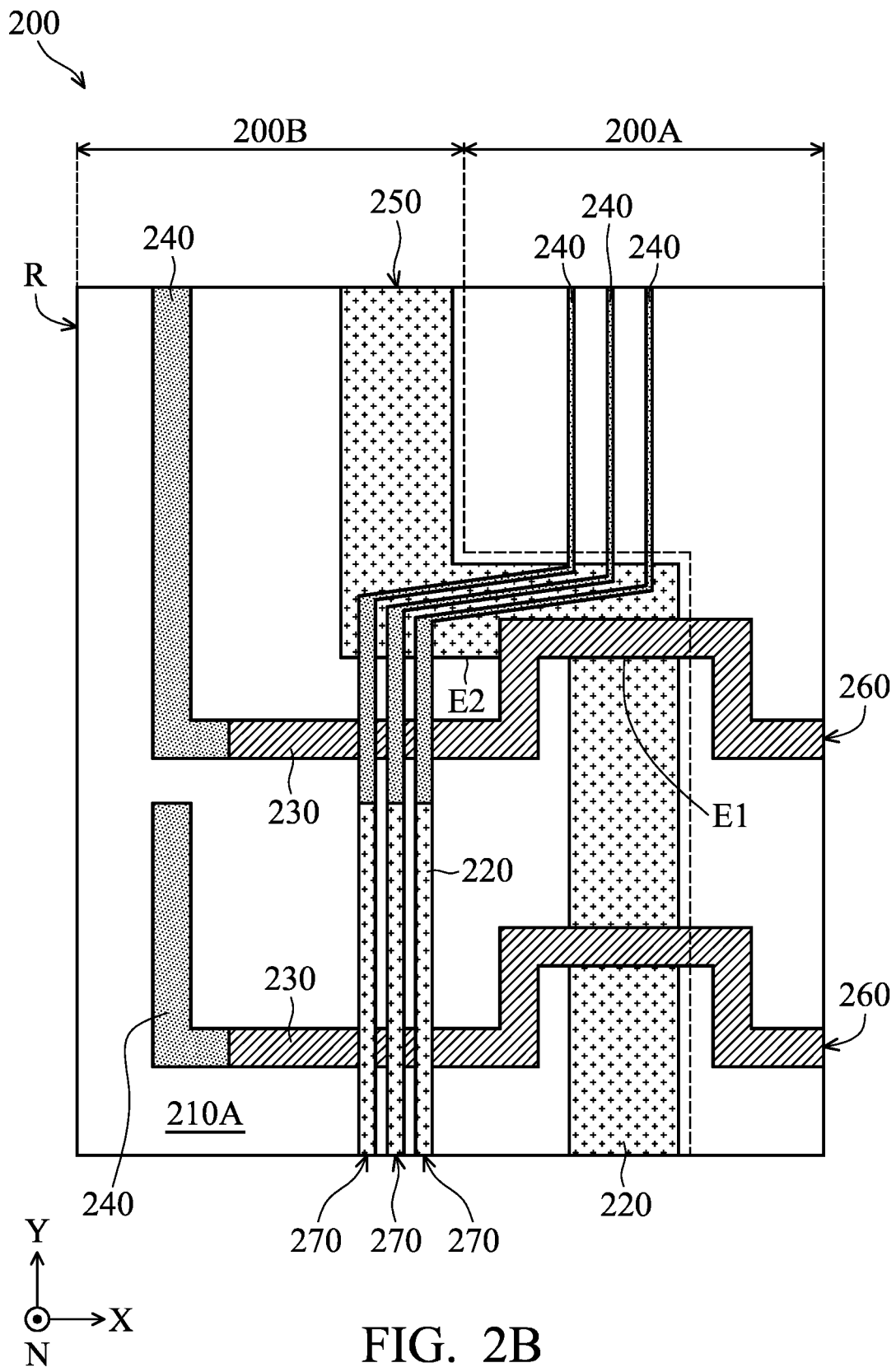
FIG. 2B is a partial top-view diagram of a conventional display device.

Refer to FIGS. 2A-2B. FIG. 2A is a top-view diagram of a display device 200 in accordance with an embodiment, and FIG. 2B is an enlarged view of a region R in FIG. 2A. As shown in FIG. 2A, the display device 200 includes a panel 210. The panel 210 may include a display region 200A and a non-display region 200B surrounding the display region 200A. The panel 210 has a normal direction N. The display region 200A is a region displaying images while the non-display region 200B is not used to display images. As a result, various conductive wirings may be configured within the non-display region 200B where the layout of the display region 200A may be designed to have a rectangular shape, a circular shape, or an arbitrary shape, but it is not limited thereto. In an embodiment, the display device 200 may include a liquid-crystal display device or a self-light-emitting device. For example, a light-emitting element of the self-light-emitting device (not shown) may be an organic light-emitting diode (OLED) or a non-organic light-emitting diode such as, but not limited to, a quantum dot light-emitting diode (Q-LED), a micro LED or a mini LED. The panel 210 may include various active devices or passive devices (not shown). For example, the panel 210 may control pixels (not shown) in the panel 210 to be a display state or an off-state via the active devices, and the active devices may include a thin-film transistor such as, but not limited to, an amorphous thin-film transistor, a low-temperature polysilicon thin-film transistor or a metal-oxide thin-film transistor.

As shown in FIGS. 2A-2B, the non-display region 200B in the display device 200 may include a first metal layer 220, a second metal layer 230, a third metal layer 240 and/or or another metal within the panel 210. "The first metal layer", "the second metal layer" and "the third metal layer" in the disclosure are at different levels. For example, in the normal direction of the panel 210 (perpendicular to the X-Y plane), the first metal layer 220, the second metal layer 230, and the third metal layer 240 are at different levels. In addition, the different levels may be formed by different process or different process sequence, but they are not limited thereto. The same level may be defined as being formed by the same process or the same process sequence. For example, during the process of forming the display device 200, the first metal layer 220 is formed before the second metal layer 230, and the second metal layer 230 is formed before the third metal layer 240. In particular, from a top-view of FIG. 2A, the third metal layer 240, the second metal layer 230, and the first metal layer 220 are in a top-down sequence. In addition, the first metal layer 220 may be electrically connected to the second metal layer 230 and/or the third metal layer 240 through a via (not shown), and the second metal layer 230 may also be electrically connected to the third metal layer 240 through another via. The first metal layer 220, the second metal layer 230, or the third metal layer 240 described above form conductive lines, including, but not limited to, gate lines, source/drain lines, common voltage (Vcom) lines, grounding wires, or other different voltage lines.

The first metal layer 220, the second metal layer 230 or the third metal layer 240 described above may be formed by first forming a mono-layer or multi-layer using deposition processes, and then patterning the metal layers described above using photolithographic processes and etching processes. The deposition process may be a chemical vapor deposition (CVD) process, a sputtering process, a resistance heating vapor deposition process, an electron beam vapor deposition process, or another suitable deposition process. For example, the CVD process may include, but is not limited to, low-pressure CVD (LPCVD), low-temperature CVD (LTCVD), rapid thermal CVD (RTCVD), plasma enhanced CVD (PECVD), atomic layer deposition (ALD), and other common processes. The photolithographic processes include photoresist coating (e.g. spin-on coating), soft baking, photomask alignment, exposure, post-exposure baking, developing, cleaning, drying (e.g. hard baking), other suitable processes or a combination thereof. In addition, the photolithographic processes may be performed or replaced by other suitable methods, such as mask-free photolithography, electron-Beam Writing and ion-Beam Writing. Etching processes include, but are not limited to, dry etching, wet etching, and other etching methods.

As shown in FIG. 2A, the display device 200 has a conductive line 250 surrounding the display region 200A in the non-display region 200B. It should be noted that the conductive line 250 is shown and other wirings are omitted in FIG. 2A, for clarity. A common voltage may be applied to the conductive line 250. The conductive line 250 is formed with the first metal layer 220.

Referring to FIG. 2B, an enlarged diagram of the region R of the display device 200 is shown. As shown in FIG. 2B, the display device 200 includes the first metal layer 220, the second metal layer 230 and the third metal layer 240. As described earlier, the first metal layer 220, the second metal layer 230 and the third metal layer 240 are at different levels, wherein the second metal layer 230 is disposed on the first metal layer 220, and the third metal layer 240 is disposed on the second metal layer 230.

As shown in FIG. 2B, the display device 200 includes the conductive line 250, a plurality of gate lines 260 and a plurality of source/drain lines 270. At least one portion of the conductive line 250, the gate lines 260 and the source/drain lines 270 is in the non-display region 200B. The gate lines 260 may be electrically connected to the gate of a film transistor (not shown) within the display region 200A while the source/drain lines 270 may be electrically connected to at least one end of the source/drain of the film transistor within the display region 200A, but they are not limited thereto.

As shown in FIG. 2B, the conductive line 250 may include the first metal layer 220. The gate lines 260 may include the third metal layer 240 and the second metal layer 230, wherein the third metal layer 240 may be electrically connected to the second metal layer 230 through a via (not shown). The third metal layer 230 of the gate lines 260 extends from the non-display region 200B to the display region 200A. The gate lines 260 include at least a portion of the second metal layer 230 overlapping the conductive line 250. In addition, the gate lines 260 include at least a portion of the second metal layer 230 is overlapping the source/drain lines 270. As shown in FIG. 2B, the source/drain lines 270 include the first metal layer 220 and the third metal layer 240, wherein the first metal layer 220 may be electrically connected to the third metal layer 240 through a via. At least a portion of the source/drain lines 270 overlaps the conductive line 250.

As shown in FIGS. 2A-2B, within the regions of the display region 200A and the non-display region 200B, the first metal layer 220, the second metal layer 230 and the third metal layer 240 are used as the wirings of the conductive line 250, the gate lines 260, and the source/drain lines 270.

In addition, as shown in FIG. 2B, the second metal layer 230 of the gate lines 260 has a side E1, and the side E1 extends substantially along the X-axis, and the conductive lines 250 has a side E2, and the side E2 extends substantially along the X-axis. From a top-view, a portion of the side E1 substantially overlaps a portion of the side E2. The electrostatic discharge effect easily occurs at the location where gate lines 260 is across the conductive line 250 (e.g. the location where the second metal layer 230 overlaps the first metal layer 220) when the passivation layer (not shown) disposed between the gate lines 260 and the conductive lines 250 is too thin, thereby punching through one or more portions of the regions of the passivation layer (not shown), which leads to a loss of electrical insulation between the first metal layer 220 and the second metal layer 230, and an electrical connection forming instead, causing the signals that are transmitted—and therefore the display—to be abnormal.

Figure 3A:
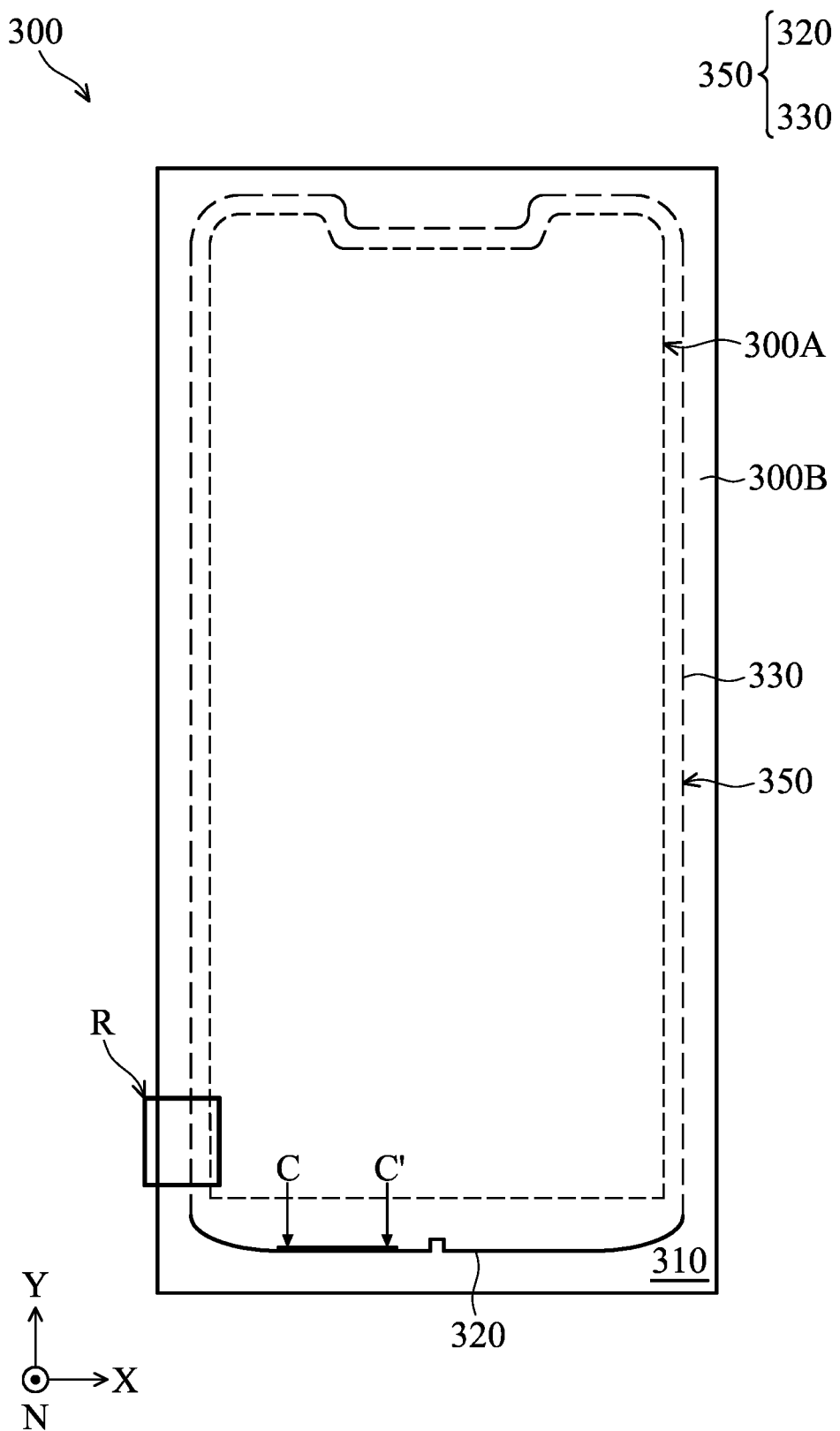
FIG. 3A is a top-view diagram of a display device in accordance with some embodiments of the disclosure.
Figure 3B:
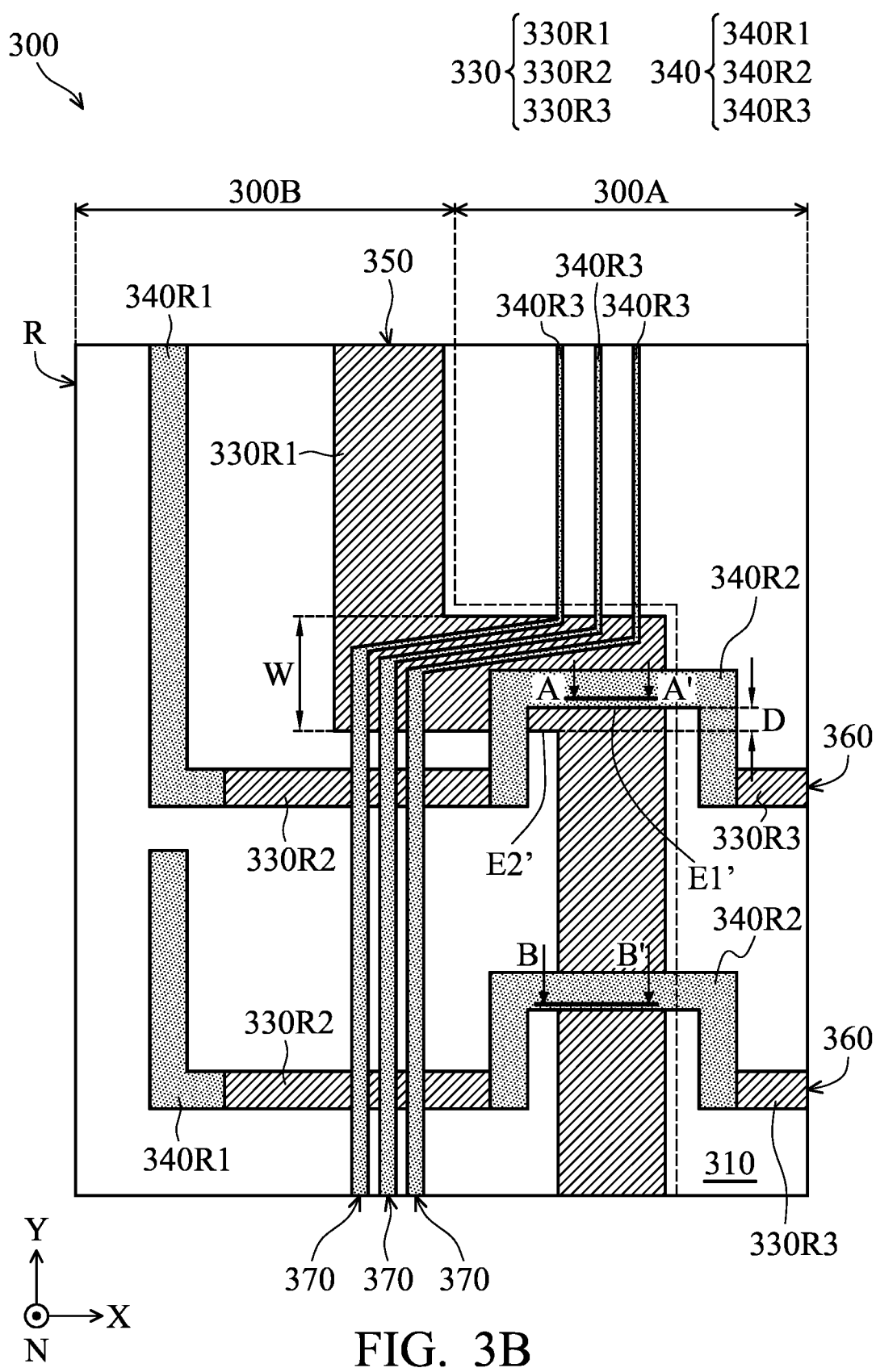
FIG. 3B is a partial top-view diagram of a display device in accordance with some embodiments of the disclosure.

Referring to FIGS. 3A-3B, a top-view diagram of a display device 300 is shown in FIG. 3A in accordance with an embodiment, and an enlarged diagram of a region R in FIG. 3A is shown in FIG. 3B. As shown in FIG. 3B, the display device 300 includes a display region 300A and a non-display region 300B surrounding the display region 300A. The display device 300 includes a panel 310 wherein the material of the panel 310 may be the same as or similar to the material of the panel 210.

As shown in FIGS. 3A-3B, the display device 300 may include a first metal layer 320, a second metal layer 330, a third metal layer 340 and/or other metal layers in the panel 310. The relative position of the first metal layer 320, the second metal layer 330 and the third metal layer 340 is the same as that described in FIGS. 2A-2B, and is not repeated herein.

As shown in FIG. 3A, the display device 300 includes a conductive line 350, wherein the conductive line 350 is in the non-display region 300B and is surrounding the display region 300A. It should be noted that the conductive line 350 is shown and other wirings are omitted in FIG. 3A, for clarity. A common voltage may be applied to the conductive line 350. As shown in FIG. 3A, the conductive line 350 includes the first metal layer 320 and the second metal layer 330. In FIG. 3A, the second metal layer 330 is represented as a dashed line and the first metal layer 320 as a solid line, indicating that the first metal layer 320 and the second metal layer 330 are located at different levels.

Referring to FIG. 3B, an enlarged diagram of a portion of the region R of the display device 300 is shown. The display device 300 within the region R includes the second metal layer 330 and the third metal layer 340. The second metal layer 330 and the third metal layer 340 are at different levels, and the third metal layer 340 is disposed on the second metal layer 330.

As shown in FIG. 3B, the display device 300 includes the conductive line 350, a plurality of gate lines 360, and a plurality of source/drain lines 370. At least a portion of the conductive line 350, the gate lines 360, and the source/drain lines 370 are in the non-display region 300B. The gate lines 360 may be electrically connected to the gate of a film transistor (not shown) within the display region 300A while the source/drain lines 370 may be electrically connected to the source/drain of the film transistor within the display region 300A.

In addition, the second metal layer 330 includes a conductive layer 330R1, a conductive layer 330R2 and a conductive layer 330R3. The conductive layer 330R1, the conductive layer 330R2, and the conductive layer 330R3 are spaced apart respectively. In some embodiments, the conductive layer 330R1 is a portion of the conductive line 350. In some embodiments, the conductive layer 330R2 and the conductive layer 330R3 are a portion of the gate lines 360. The third metal layer 340 includes a conductive layer 340R1, a conductive layer 340R2 and a conductive layer 340R3. The conductive layer 340R1, the conductive layer 340R2, and the conductive layer 340R3 are spaced apart respectively. In some embodiments, the conductive layer 340R1 and the conductive layer 340R2 are a portion of the gate lines 360. In some embodiments, the conductive layer 340R3 is a portion of the source/drain lines 370.

As shown in FIG. 3B, the conductive line 350 includes the conductive layer 330R1 with a first extension direction, and the first extension direction is such as the Y-axis (as shown in FIG. 3A). The gate lines 360 include the conductive layer 340R1, the conductive layer 330R2, the conductive layer 340R2 and the conductive layer 330R3. The conductive layer 330R2 is electrically connected to the conductive layer 340R1 (e.g. the conductive layer 330R2 is electrically connected to the conductive layer 340R1 through a via), and the conductive layer 340R2 is electrically connected to the conductive layer 330R2 and the conductive layer 330R3, and is between the conductive layer 330R2 and the conductive layer 330R3. The conductive layer 330R3 extends from the non-display region 300B to the display region 300A. At least a portion of the gate lines 360 at least partially overlaps the conductive line 350. For example, the conductive layer 340R2 at least partially overlaps a portion of the conductive layer 330R1. At least a portion of the gate lines 360 at least partially overlaps the source/drain lines 340R3.

In some embodiments, the conductive layer 340R2 of the gate lines 360 has an upside-down U shape across the conductive line 350. In some embodiments, the conductive layer 340R2 has a side E1' that extends substantially along the X-axis and the conductive layer 330R1 has a side E2' that extends substantially along the X-axis. The side E1' and the side E2' may be defined as the two sides with the shortest distance between the conductive layer 340R2 and the conductive line 350. In some embodiments, the shortest distance D is between the side E1' and the side E2'. If a maximum width W of the conductive line 350 in a direction substantially parallel with the X-axis is 40 μm, the shortest distance D described above is greater than or equal to 10 μm, and less than or equal to 22 μm. Given the distance D within the above range, the electrostatic discharge effect in the display device 300 due to substantially overlapping of the side E1' and the side E2' may be reduced, thereby reducing the probability of the punch-through of the passivation layer (not shown) disposed between the conductive layer 330R1 and the conductive layer 340R2 by static electricity, and decreasing conductive layer 330R1 and conductive layer 340R2 from being electrically connected. In some embodiments, the ratio of the distance D to the width W is from 0.25 to 0.55.

As shown in FIG. 3B, the source/drain lines 370 include the conductive layer 340R3. In some embodiments, at least a portion of the conductive layer 340R3 at least partially overlaps with the conductive line 350, and at least a portion of the conductive layer 340R3 at least partially overlaps with the conductive layer 330R2 of the gate lines 360.

In some embodiments, both the second metal layer 330 and the third metal layer 340 are used as the wirings of the conductive line 350, the gate lines 360, and the source/drain lines 370 in the region R. In such an embodiment, the first metal layer 320 is not used as a wiring of the conductive line 350, the gate lines 360, or the source/drain lines 370, thereby reducing the probability of electrostatic discharge, which is described in detail in the description of FIGS. 4A-4C that follows.

Figure 4A:
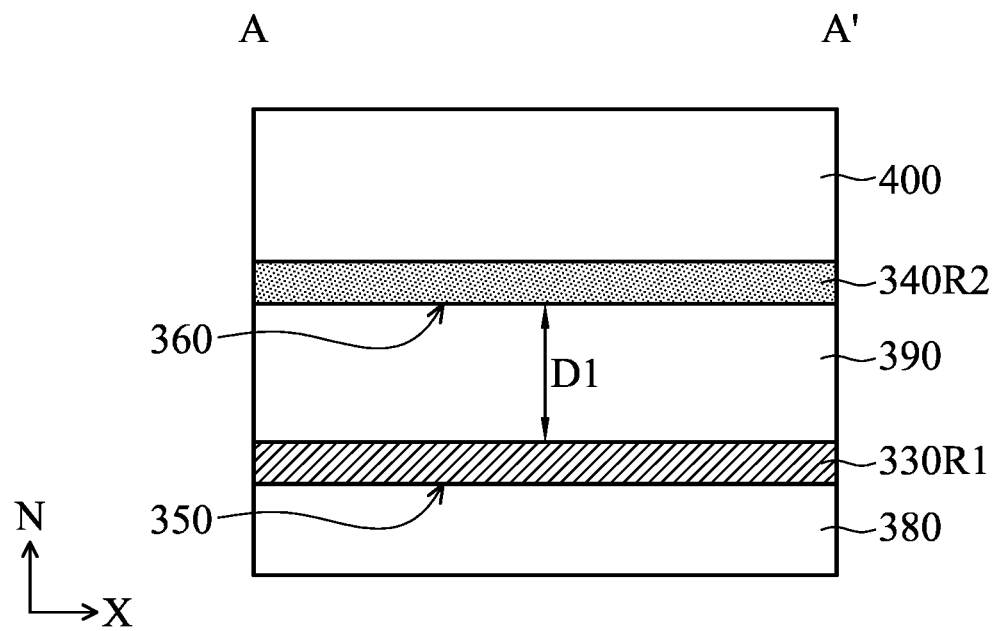
FIGS. 4A-4C are cross-sectional diagrams of a display device in accordance with some embodiments of the disclosure.
Figure 4B:
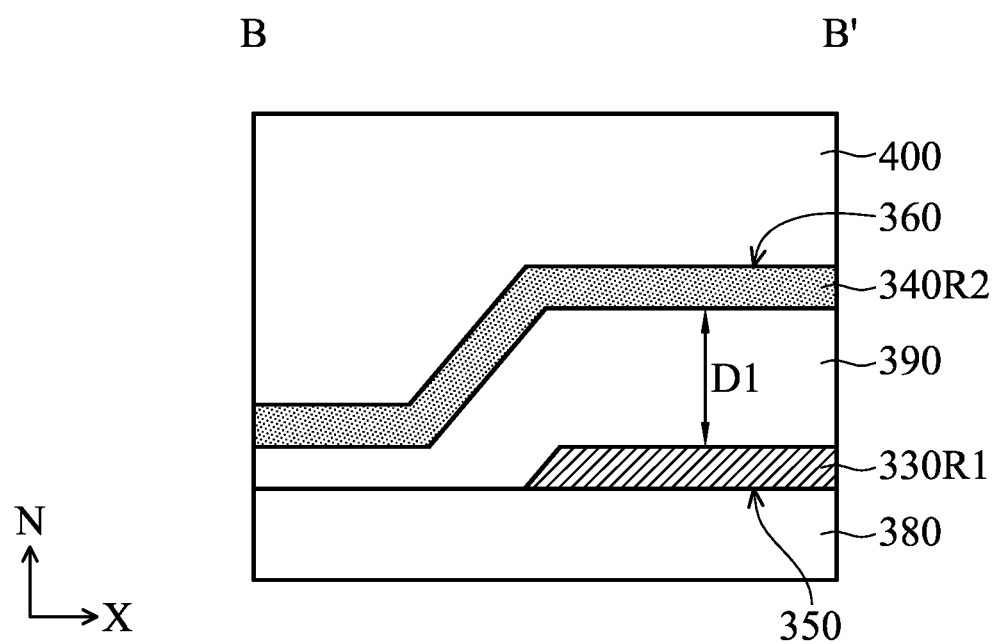

Referring to FIGS. 4A-4B, FIG. 4A is a cross-sectional diagram illustrating the display device 300 along line A-A'. FIG. 4B is a cross-sectional diagram illustrating the display device 300 along line B-B'. It should be noted that FIGS. 4A-4B illustrate the relative position of the second metal layer 330 and the third metal layer 340 with other components omitted. As shown in FIG. 4A, the display device 300 includes a passivation layer 380, a passivation layer 390 and a passivation layer 400. The material of the passivation layer 380, the passivation layer 390 and the passivation layer 400 may be the same as or similar to the material of the passivation layer 130, which is not repeated herein. In some embodiments, the thickness of the passivation layer 380 may be from 1500 angstroms to 2500 angstroms. In some embodiments, the thickness of the passivation layer 390 and the passivation layer 400 is from 3500 angstroms and 4500 angstroms. In some embodiments, the thickness of the passivation layer 400 is greater than or equal to the thickness of the passivation layer 390. In another embodiment, the thickness ratio of the passivation layer 380 to the passivation layer 390 is from 0.4 to 0.6.

As shown in FIGS. 4A-4B, the conductive layer 330R1 is disposed on the passivation layer 380, and the conductive layer 340R2 is disposed on the passivation layer 390. In this embodiment, the conductive layer 330R1 is used as a wiring of the conductive line 350 in the region R, and the conductive layer 340R2 is used as a wiring of the gate lines 360 in the region R. As shown in FIGS. 4A-4B, there is a distance D1 between the top surface of the conductive line 350 and the bottom surface of the gate lines 360. In some embodiments, the distance D1 is greater than or equal to 3500 angstroms, and less than or equal to 4500 angstroms. The first metal layer 220 and the second metal layer 230 are respectively used as the wirings of the conductive line 250 and the gate lines 260 in the display device 200 in FIGS. 2A-2B. Electrostatic discharges may occur in the region where the side E1 of the gate lines 260 substantially overlaps with the side E2 of the conductive line 250 because the distance between the first metal layer 220 and the second metal layer 230 in the normal direction N of the panel 210 is less than 2000 angstroms. Display device 300 may inhibit electrostatic discharge more effectively than display device 200, reducing the probability of the passivation layer being punched through and thereby decreasing display abnormalities by disposing the passivation layer 390 between the conductive line 350 (using the conductive layer 330R1) and the gate lines 360 (using the conductive layer 340R2), and increasing the shortest distance D between the side E1' and the side E2'.

Figure 4C:
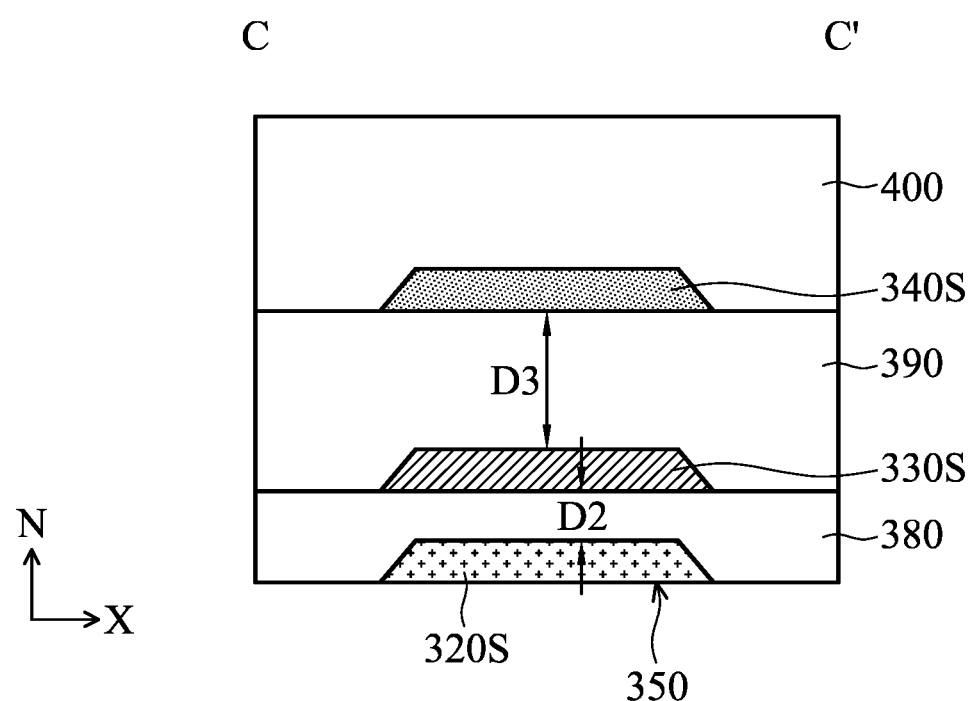

Referring to FIG. 4C, a cross-sectional diagram is shown illustrating the display device 300 along line C-C'. It should be noted that FIG. 4C illustrates the relative position of the first metal layer 320, the second metal layer 330 and the third metal layer 340 with other components omitted. The first metal layer 320, the second metal layer 330 and the third metal layer 340 include a conductive layer 320S, a conductive layer 330S and a conductive layer 340S, respectively. The conductive later 320S, the conductive layer 330S and the conductive layer 340S are in the non-display region 300B. As shown in FIG. 4C, the conductive layer 330S is disposed on the passivation layer 380, and the conductive layer 340S is disposed on the passivation layer 390. In some embodiments, the conductive layer 320S may be used as the wiring of the conductive line 350, wherein the conductive layer 320S has a second extension direction, for example, the X-axis (as shown in FIG. 3A) is different from the first extension direction of the conductive layer 330R1 described above, such as the Y-axis (as shown in FIG. 3A). The conductive layer 330R1 shown in FIG. 3B is connected to the conductive layer 320S shown in FIG. 4C through a via (not shown).

As shown in FIGS. 3A and 4C, there is a distance D2 between a top surface of the conductive layer 320S of the conductive line 350 and a bottom surface of the conductive layer 330S while there is a distance D3 between the top surface of the conductive layer 330S and the bottom surface of the conductive layer 340S. In some embodiments, the distance D3 is greater than the distance D2. In some embodiments, the distance D2 is greater than or equal to 1500 angstroms, and less than or equal to 2000 angstroms. In some embodiments, the distance D3 is greater than or equal to 3500 angstroms, and less than or equal to 4500 angstroms. In some embodiments, the ratio of the distance D2 to the distance D3 is in the range of 0.4 to 0.6.

In some embodiments, the conductive layer 330R1 may be referred to as the first section of the conductive line 350, and the conductive layer 320S may be referred to as the second section of the conductive line 350. The distance between the first metal layer 320 and the second metal layer 330 is less than the distance between the second metal layer 330 and the third metal layer 340, thereby easily resulting in an electrostatic discharge at the edges of the first metal layer 320 and the second metal layer 330. In some embodiments, the display device 300 uses fewer portions of the first metal layer as wirings. For example, the display device 300 uses the conductive layer 330R1 of the second metal layer as the conductive line 350 instead of the first metal layer 230 of the display device 200 shown in FIG. 2B. Accordingly, the yield of the display device 300 is improved.

In some embodiments, the conductive line 350 may include, but is not limited to, a bi-layer metal material, such as a bi-layer structure of Mo/Al or Ti/Cu. For example, the conductive layer 320S is the bi-layer structure described above. In some embodiments, the conductive layer 330R1, 330R2, 330R3, 340R1, 340R2, 340R3, 330S and 340S may include a tri-layer metal material, such as, but not limited to, a tri-layer structure of Mo/Al/Mo or Ti/Cu/Ti.

It should be noted that the first metal layer 320, the second metal layer 330, and the third metal layer 340 may have different thicknesses in different regions. For example, the top surface and/or the bottom surface of the conductive layer 330R1 may not overlap with the conductive layer 330S, but the disclosure is not limited thereto.

Although some embodiments of the disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the disclosure. Moreover, the scope of the present application is not intended to be limited to the particular embodiments of the process, machine, manufacture, composition of matter, means, methods and steps described in the specification. As a person having ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim forms a respective embodiment, and the scope of the disclosure also encompasses every claim and the combination thereof.

What is claimed is:

1. A display device having a non-display region, comprising:
   a first conductive line to which a voltage is applied; and
   a second conductive line which is at least partially overlapped with the first conductive line, wherein the second conductive line is a gate line,
   wherein a distance between the first conductive line and the second conductive line in a normal direction of the display device is greater than or equal to 3500 angstroms, and less than or equal to 4500 angstroms.

2. The display device of claim 1, further comprising a passivation layer disposed between the first conductive line and the second conductive line.

3. The display device of claim 2, wherein a material of the passivation layer comprises silicon oxide, silicon nitride, silicon oxynitride, or epoxy.

4. The display device of claim 2, wherein a thickness of the passivation layer is in a range between 3500 angstroms and 4500 angstroms.

5. The display device of claim 1, wherein the display device comprises a self-light-emitting device.

6. The display device of claim 5, wherein a light-emitting element of the self-light-emitting device is an organic light-emitting diode.

7. The display device of claim 1, wherein one of the first conductive line and the second conductive line is a bi-layer structure.

8. The display device of claim 7, wherein a material of the first conductive line comprises Mo, Al, Ti, Cu or a combination thereof.

9. The display device of claim 7, wherein a material of the second conductive line comprises Mo, Al, Ti, Cu or a combination thereof.

10. The display device of claim 1, wherein at least a portion of the second conductive line is disposed on the first conductive line from a cross-sectional view of the display device.

11. The display device of claim 1, further comprising a third conductive line at least partially overlapped with the first conductive line.

12. The display device of claim 11, wherein the third conductive line is disposed at a different level than the first conductive line from a cross-sectional view of the display device.

* * * * *